(12) United States Patent
Yang et al.

(10) Patent No.: US 7,932,127 B2
(45) Date of Patent: Apr. 26, 2011

(54) METHOD OF MAKING CMOS IMAGE SENSOR-HYBRID SILICIDE

(75) Inventors: Jianping Yang, Shanghai (CN);
Jieguang Huo, Shanghai (CN);
Chunyan Xin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/700,700

(22) Filed: Feb. 4, 2010

(65) Prior Publication Data

US 2010/0136737 A1    Jun. 3, 2010

Related U.S. Application Data

(62) Division of application No. 11/258,973, filed on Oct. 25, 2005, now Pat. No. 7,700,399.

(30) Foreign Application Priority Data

Jun. 7, 2005 (CN) .......................... 2005 1 0026694

(51) Int. Cl.
*H01L 21/00* (2006.01)
(52) U.S. Cl. ........ 438/98; 438/57; 438/60; 257/E21.165
(58) Field of Classification Search .................... 438/57, 438/60, 98; 257/E21.165
See application file for complete search history.

(56) References Cited

U.S. PATENT DOCUMENTS

| | | | |
|---|---|---|---|
| 5,863,820 A | 1/1999 | Huang | |
| 6,023,081 A | 2/2000 | Drowley et al. | |
| 6,040,593 A | 3/2000 | Park | |
| 6,137,127 A | 10/2000 | Merrill | |
| 6,184,115 B1 | 2/2001 | Kou et al. | |
| 6,194,258 B1 | 2/2001 | Wuu | |
| 6,479,873 B1 | 11/2002 | Yoshiyama et al. | |
| 6,908,839 B2 | 6/2005 | Rhodes | |
| 7,700,399 B2 | 4/2010 | Yang et al. | |
| 2003/0197228 A1 | 10/2003 | Okuda et al. | |

OTHER PUBLICATIONS

Notice of Allowance for U.S. Appl. No. 11/258,973, mailed on Nov. 4, 2009, 7 pages.
Final Office Action for U.S. Appl. No. 11/258,973, mailed on Jul. 2, 2009, 9 pages.
Non-Final Office Action for U.S. Appl. No. 11/258,973, mailed on Mar. 6, 2009, 14 pages.

(Continued)

*Primary Examiner* — Jarrett J Stark
(74) *Attorney, Agent, or Firm* — Kilpatrick Townsend and Stockton LLP

(57) ABSTRACT

Techniques for manufacturing a CMOS image sensor are provided. A semiconductor substrate is provided, and at least one isolation region can be formed between a periphery region of the substrate and a photo-sensing region of the substrate. A first well in the periphery region and a second well in the photo-sensing region of the substrate are formed. A third well associated with a photodiode is also formed. A gate oxide layer, polysilicon layer, and first metal layer are respectively deposited. The polysilicon layer and first metal layer are etched to form an least one gate in the photo-sensing region and at least one gate in the periphery region. At least two doped regions in the first well are formed, as well as a doped region in the second well. A silicide block layer is deposited over the photo-sensing region of the substrate. A second metal layer is deposited at least over the periphery region after deposition of the silicide block. The substrate is exposed to a thermal environment to form silicide. The second metal layer is removed by etching.

8 Claims, 8 Drawing Sheets

OTHER PUBLICATIONS

Final Office Action for U.S. Appl. No. 11/258,973, mailed on Oct. 27, 2008, 12 pages.

Non-Final Office Action for U.S. Appl. No. 11/258,973, mailed on May 12, 2008, 11 pages.

Requirement for Restriction/Election for U.S. Appl. No. 11/258,973 mailed on Mar. 13, 2008, 6 pages.

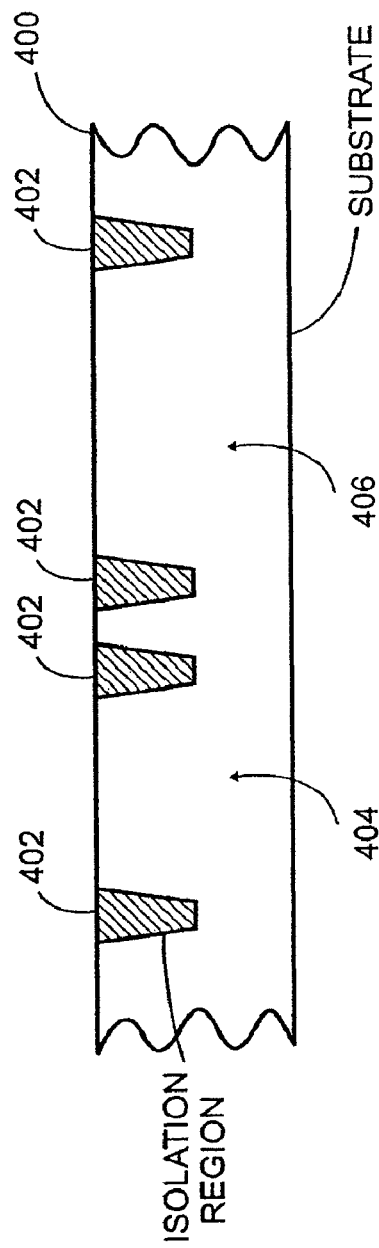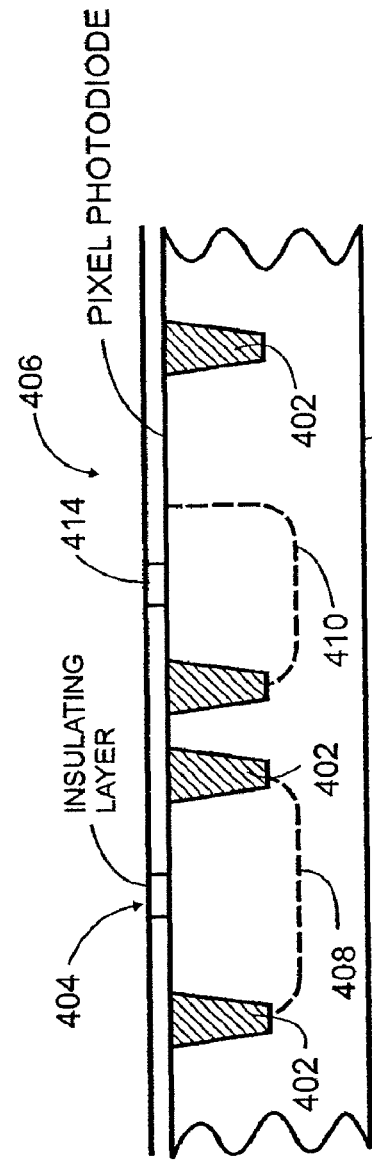
FIGURE 4A
FIGURE 4B

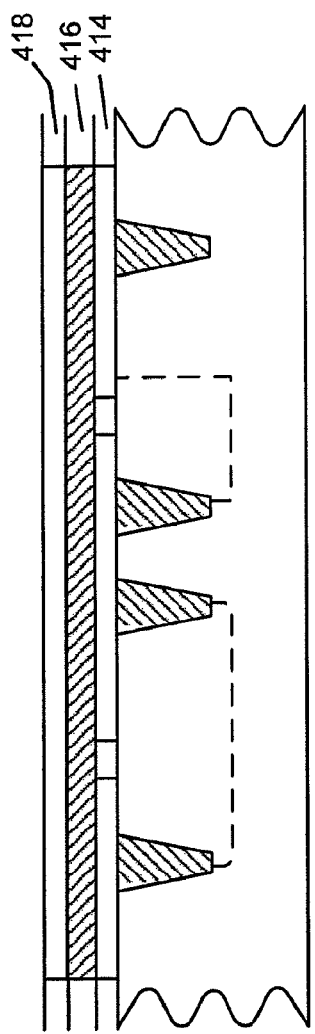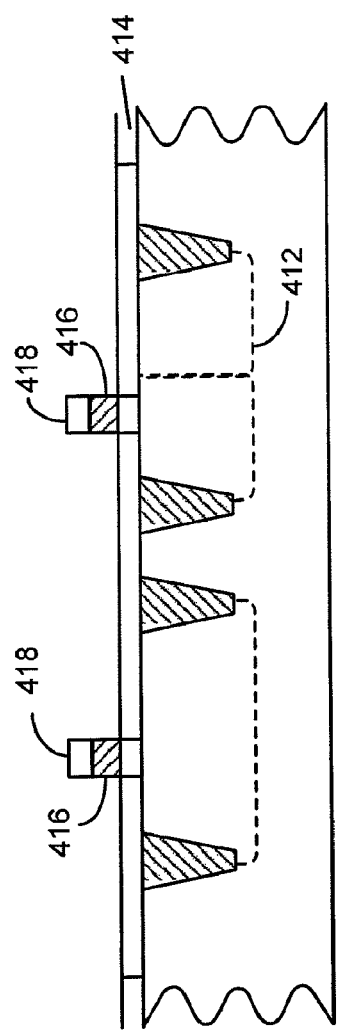

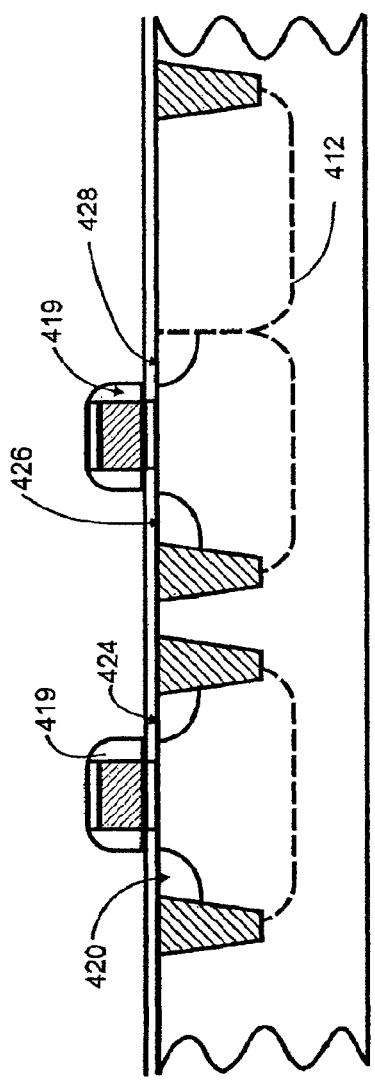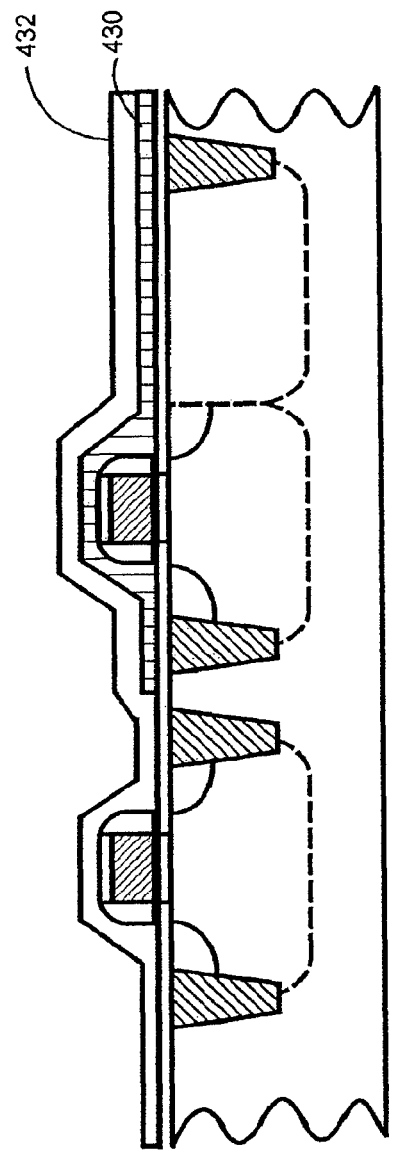

US 7,932,127 B2

METHOD OF MAKING CMOS IMAGE SENSOR-HYBRID SILICIDE

CROSS-REFERENCES TO RELATED APPLICATIONS

This application is a Divisional Application of U.S. patent application Ser. No. 11/258,973, filed Oct. 25, 2005, which claims priority to Chinese Patent Application No. 200510026694.7, filed on Jun. 7, 2005, both of which are commonly assigned and are hereby incorporated by reference in their entirety for all purposes.

BACKGROUND OF THE INVENTION

The present invention is directed to integrated circuits and their processing for the manufacture of semiconductor devices. More particularly, the invention provides a method and device with selective silicide formation. Merely by way of example, the invention has been applied to complimentary metal oxide semiconductor (CMOS) image sensing. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. One such type of IC is a CMOS imaging system. The CMOS imaging system can be fabricated on standard silicon production lines and therefore inexpensive to make. Additionally, the CMOS image sensor consumes low power and especially suitable for portable applications.

Specifically, a CMOS image system converts a light signal into an electrical signal, whose intensity is related to the light intensity. FIG. 1 is a simplified diagram for a conventional CMOS imaging system 100. System 100 is configured into two regions, a photo-sensing region 110 and a periphery region 120. In photo-sensing region 110, an array of CMOS image sensors are organized in rows and columns to detect light intensity. Circuits providing additionally functions are disposed in periphery region 120. For example, periphery region 120 can include signal amplification circuits, analog-to-digital converters, image signal processor, or a digital signal processor.

FIG. 2 is a simplified circuit diagram of a CMOS image sensor. The CMOS image sensor 200 corresponds to one pixel and includes a reset transistor 210, a photodiode 220, a source follower 230, a selecting transistor 240, and a bias resistor 250. The photodiode 220 receives a light signal and generates a photocurrent from a node 260 to a node 262. Additionally, a leakage current also flows through the photodiode 220 in the same direction. This leakage current is sometimes referred to as dark current of the CMOS image sensor. One source for the leakage current is the source region of the reset transistor 210, which is connected to the photodiode 220. A large leakage current adversely affects the performance of the CMOS image sensor.

In a CMOS device, including a CMOS imaging system, salicide can be used to improve RC delay. However, a conventional salicide process has certain limitations when applied to a CMOS image system. The formation of silicide in most areas of the photo sensing region of the CMOS image sensor (such as photodector diode areas and source/drain regions in photo sensing area) generally increases leakage current, and thus degrades sensor image quality.

Accordingly, a conventional silicide block technique using a photo process has been proposed. Unfortunately, this technique typically does not have the requisite alignment accuracy. It generally does not provide consistent control for selective growth of silicide. That is to say, it is difficult to form silicide on a polysilicon gate in the photo-sensing region without forming unwanted silicide on other areas of the photo-sensing region. Another conventional approach is an etch back process to remove silicide from the source/drain regions of the photo-sensing area to selectively form silicide on a gate. However, the etch back process is often difficult to control and reduces production yield.

From the above, it is seen that an improved technique for a CMOS image sensor is desired.

BRIEF SUMMARY OF THE INVENTION

According to the present invention, techniques directed to integrated circuits and their processing for the manufacture of semiconductor devices are provided. More particularly, the invention provides a method and device for selective silicide formation for the manufacture of integrated circuits. Merely by way of example, the invention has been applied to CMOS image sensors. But it would be recognized that the invention has a much broader range of applicability.

In a specific embodiment, the invention provides a method for manufacturing a CMOS image sensor. A semiconductor substrate is provided, and at least one isolation region is formed between a periphery region of the substrate and a photo-sensing region of the substrate. A first well in the periphery region and a second well in the photo-sensing region of the substrate are formed. A third well associated with a photodiode is also formed in the photo-sensing region of the substrate. A gate oxide layer, polysilicon layer, and first metal layer are respectively deposited on a surface of the substrate. The polysilicon layer and first metal layer are etched to form an least one gate in the photo-sensing region and at least one gate in the periphery region. Spacers for each of the at least one gate in the photo sensing region and the at least one gate in the periphery region are formed. At least two doped regions in the first well are formed by implanting a first plurality of ions. A second plurality of ions are implanted to form a doped region in the second well. A silicide block layer is deposited over the photo-sensing region of the substrate. A second metal layer is deposited at least over the periphery region after deposition of the silicide block. The substrate is exposed to a thermal environment to form silicide in the at least two doped regions in the first well and the at least one gate in the photo-sensing region. Next, residual second metal layer is removed by etching.

In another embodiment, selective formation of silicide can be accomplished by using a first and second thermal treatment. The first thermal treatment can form silicide in gate regions of an image sensor after gates structures are formed using a polysilicon layer and metal layer. The second thermal treatment, occurring after deposition of silicide block over the photo-sensing region and deposition of a second metal layer over the substrate surface, can be used to form silicide in exposed source/drain regions of transistors in the periphery region.

Many benefits are achieved by way of the present invention over conventional techniques. For example, the present technique provides an easy to use process that relies upon conventional technology. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 4A-4H are simplified diagrams illustrating a CMOS image system during manufacturing according to an embodiment of the present invention.

DETAILED DESCRIPTION OF THE INVENTION

According to the present invention, techniques directed to integrated circuits and their processing for the manufacture of semiconductor devices are provided. More particularly, the invention provides a method and device for selective silicide formation for the manufacture of integrated circuits. Merely by way of example, the invention has been applied to CMOS image sensors. But it would be recognized that the invention has a much broader range of applicability.

Figure 1:
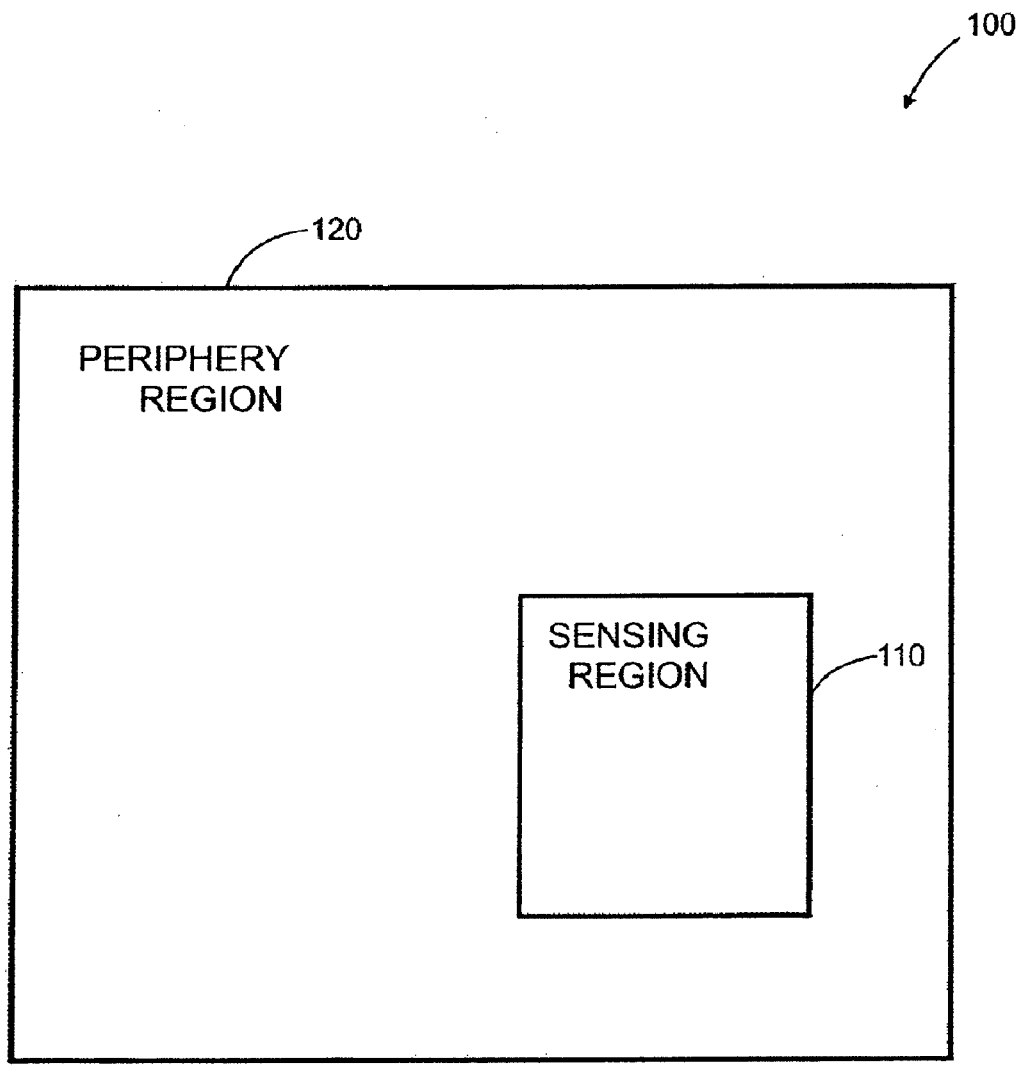
FIG. 1 is a simplified diagram for a conventional CMOS image system.
Figure 2:
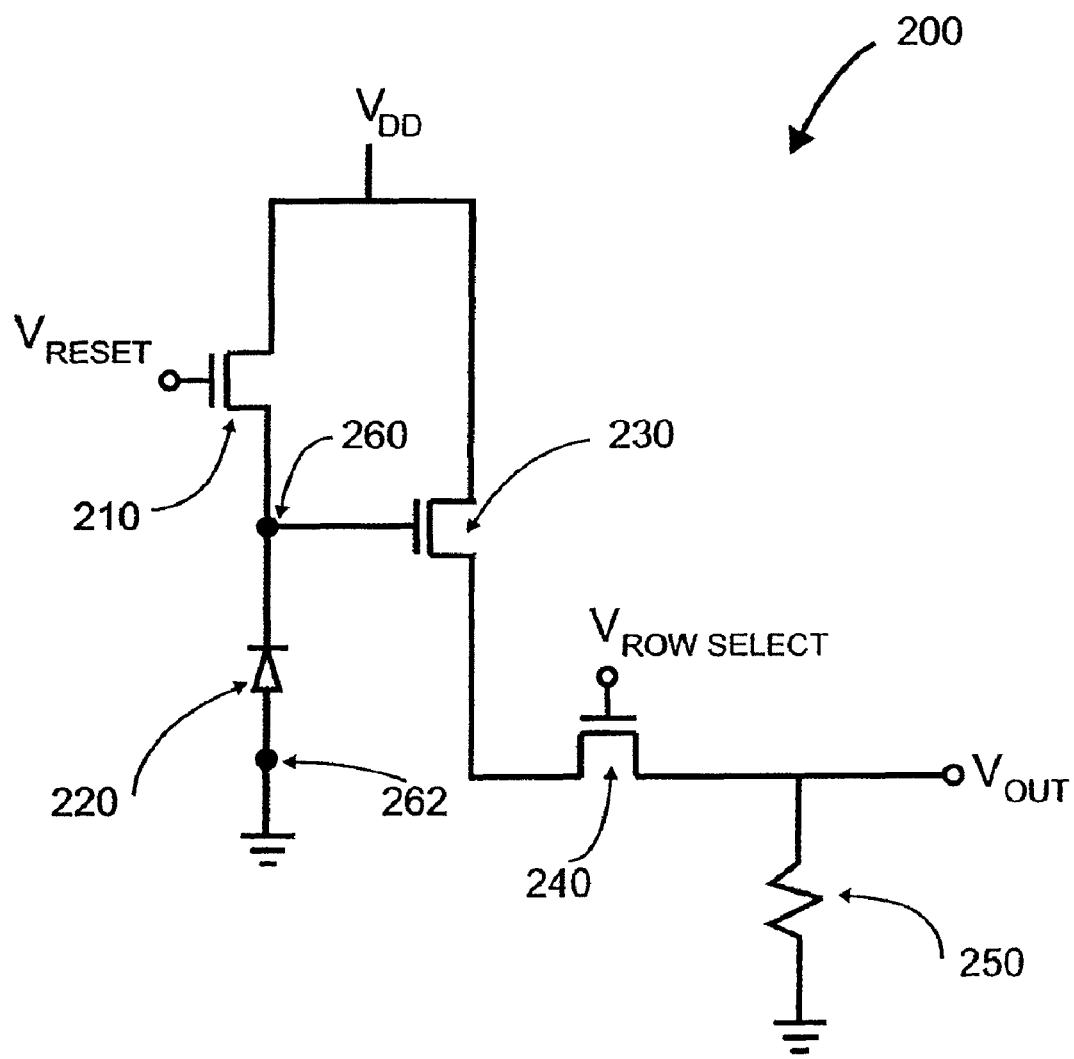
FIG. 2 is a simplified diagram for a conventional CMOS image sensor.
Figure 3:
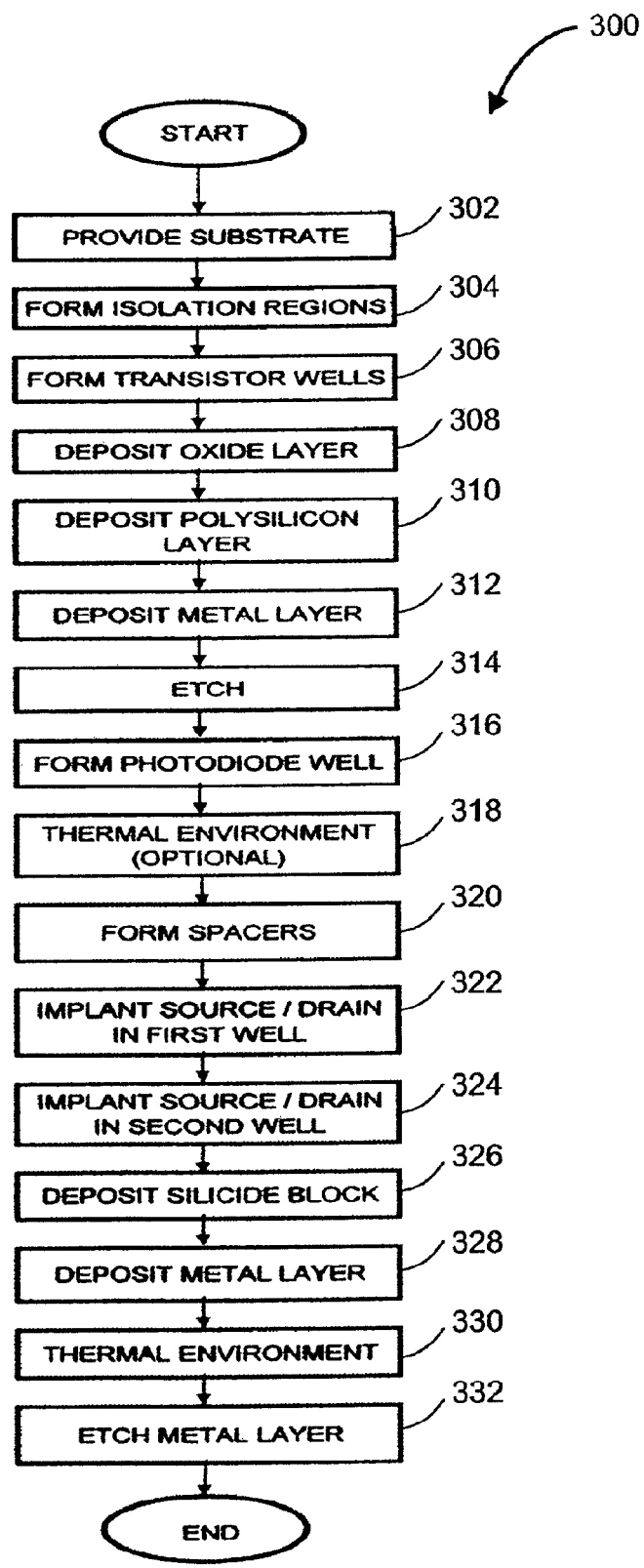
FIG. 3 illustrates a simplified method for manufacturing a CMOS image system according to an embodiment of the present invention.

FIG. 3 shows a simplified method 300 for forming image sensor according to an embodiment of the present invention. A method according to an embodiment of the present invention may be outlined as follows.

1. In step 302, provide a substrate;
2. In step 304, form at least one of isolation region between a periphery region of the substrate and a photo-sensing region of the substrate;
3. In step 306, form transistor wells;
4. In step 308, deposit an oxide layer on a surface of the substrate;
5. In step 310, deposit a polysilicon layer over the gate oxide layer;
6. In step 312, deposit a first metal layer over the polysilicon layer;
7. In step 314, etch the polysilicon layer and first metal layer to form an least one gate structure in each of the photo-sensing region and periphery region;
8. In step 316, form a third well in the photo-sensing region of the substrate, the third well being associated the photodiode;
9. In optional step 318, expose the substrate to a first thermal environment to form silicide for the gate structure;
10. In step 320, form spacers for each of the at least one gate in the photo sensing region and the at least one gate in the periphery region;
11. In step 322, implant a first plurality of ions to form a doped source region and a doped drain region in the first well;
12. In step 324, implant a second plurality of ions to form a doped source region and a doped drain region in the second well;
13. In step 326, deposit a silicide block layer over the photo-sensing region of the substrate;
14. In step 328, deposit a second metal layer at least over the periphery region;
15. In step 330, expose the substrate to a second thermal environment to form silicide in the source and drain region in the second well (and, optionally, the at least one gate structures in the photo-sensing region);
16. In step 332, etch, after exposing the substrate to the thermal environment, to remove any residue of the second metal layer; and
17. Perform other steps, as desirable.

As shown, the above sequence of steps provides a way of processing regions for selective silicide formation for gate structures and periphery source/drain regions without unwanted silicide formation in certain areas of the photo-sensing region. Thus, this method improves device performance and increases device yields over conventional methods. Further details of these steps can be found throughout the present specification and more particularly below. These steps are merely examples, which should not unduly limit the scope of the claims herein. One of ordinary skill in the art would recognize many other variations, modifications, and alternatives. For example, in alternative embodiment, step 318 can be omitted. The substrate can be preferably exposed to a single thermal environment to form silicide in all wanted areas at once.

FIGS. 4A-4F show a process for forming an images sensor according to an embodiment of the present invention. These diagrams are merely an example, which should not unduly limit the scope of the claims. One of ordinary skill in the art would recognize many variations, alternatives, and modifications.

Figure 4G:
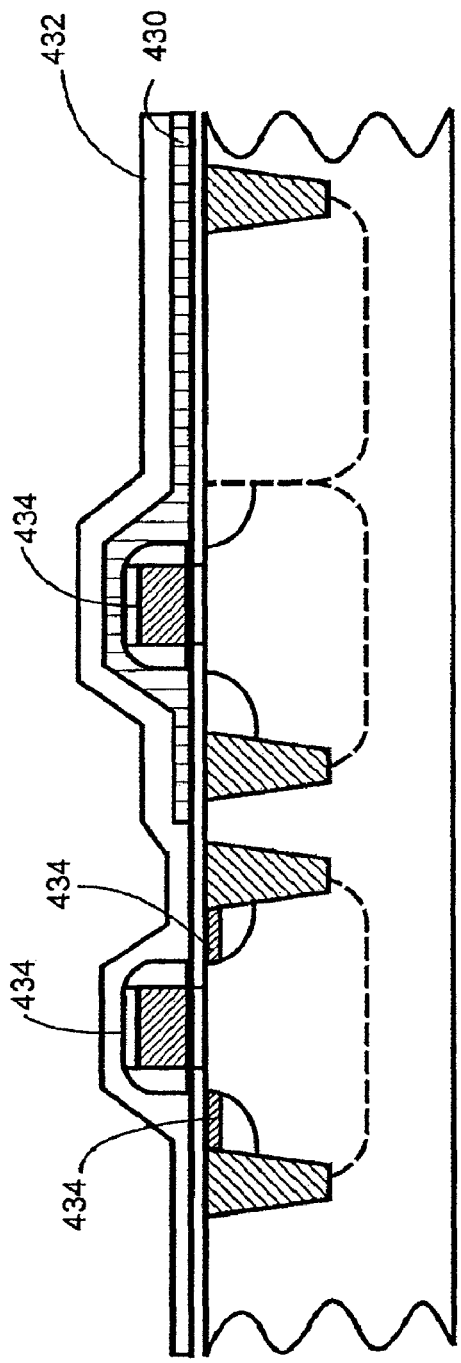

As shown in FIG. 4A, isolation regions 402, or shallow trench isolations, are formed in substrate 400. Substrate 400 can be a semiconductor substrate, such a silicon substrate. Each of isolation regions 402 can be a trench filled by silicon oxide, silicon dioxide, or other insulating materials. Periphery region 404 and photo-sensing region 406 are at least in part confined by isolation regions 402. In a specific embodiment of the present invention, at least one isolation region is needed between periphery region 404 and photo-sensing region 406.

As shown in FIG. 4B, transistor wells 408 and 410 are formed. An n-type well 410 and a p-type well 408 are formed in a semiconductor substrate 400. In an embodiment of the present invention, the n-type well 410 and the p-type well 408 can be formed with ion implantation processes and/or diffusion processes. The n-type dopants typically can be arsenic, phosphorous, or antimony, and the p-type dopants typically can be boron. The depth of the n-type well 410 ranges from 0.5 μm to 1.0 μm, and the doping concentration of the n-type well 410 ranges from $5 \times 10^{16}$ cm$^{-3}$ to $3 \times 10^{17}$ cm$^{-3}$. The depth of the p-type well 408 ranges from 0.5 μm to 1.0 μm, and the doping concentration of the p-type well 408 ranges from $5 \times 10^{16}$ cm$^{-3}$ to $3 \times 10^{17}$ cm$^{-3}$.

Referring again to FIG. 4B, a gate oxide layer 414 is formed on the semiconductor substrate 400. In one embodiment, the gate oxide layer includes silicon oxide. The gate oxide layer is grown or deposited. The thickness of the gate oxide layer can ranges from 150 Å to 400 Å.

Next, as illustrated by FIG. 4C, a polysilicon layer 416 is deposited over gate oxide layer 414. In one embodiment, the deposition may include chemical vapor deposition, low pressure chemical vapor deposition, plasma enhanced chemical vapor deposition, and/or sputtering deposition. The thickness of the polysilicon layer 416 can range from 1800 Å to 2200 Å. In yet another embodiment, the polysilicon layer 416 is doped either n-type or p-type. The dopant concentration may range from $1 \times 10^{18}$ cm$^{-3}$ to $4 \times 10^{19}$ cm$^{-3}$. A metal layer 418 is next deposited over the polysilicon layer 416. In one embodiment, metal layer 418 can include at least one of tungsten, titanium, nickel, and cobalt. Deposition of metal layer 418 can include chemical vapor deposition, low pressure chemical vapor deposition, plasma enhanced chemical vapor deposition, and/or sputtering deposition.

In FIG. 4D, the polysilicon layer 416 and metal layer 418 are etched according to an embodiment of the present invention. As shown in FIG. 4D, polysilicon layer 416 and metal layer 418 are selectively etched to form polysilicon gates. The etching process may include a dry etch and/or a wet etch. In one embodiment, a polysilicon gate is located on the n-type well 410, and another polysilicon gate located on the p-type well 408.

Next, a photodiode well 412 is formed in the semiconductor substrate 400. In one embodiment, the photodiode well 412 has p-type conductivity. In another embodiment, the photodiode well 412 is formed with an ion implantation process through the gate oxide layer 414. For example, the implant energy ranges from 100 Kev to 250 Kev, and the dose ranges from $10^{12}$ to $10^{14}$ cm$^{-2}$. As another example, the ion implantation process is performed with a barrier layer. The barrier layer may be patterned by a photolithography process using a photo mask.

In FIG. 4E, spacers 419 are formed on each side of polysilicon gates in one embodiment. Also, source/drain regions 420, 424, 426, and 428 are formed by an ion implantation process through gate oxide layer 414 and/or a diffusion process. For example, the implant energy ranges from 40 Kev to 80 Kev, and the dose ranges from $10^3$ to $10^5$ cm$^{-2}$. As another example, the ion implantation process is performed with a barrier layer. The barrier layer may be patterned by a photolithography process using a photo mask.

Figure 4H:
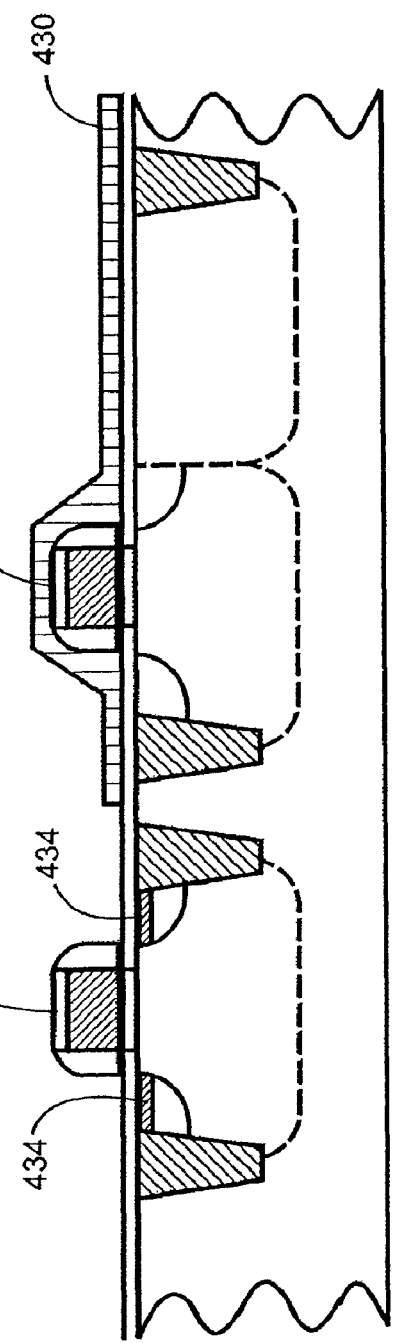

As illustrated in FIG. 4F, a silicide block layer 430 is deposited over photo-sensing region 406. A metal layer 432 is next deposited at least over desired areas of the periphery region 404 for silicide formation. In one embodiment, metal layer 432 is deposited by chemical vapor deposition. In an embodiment of the present invention, metal layer 432 can be deposited over the entire surface of substrate 400. Silicide block layer 430 will prevent silicide formation in photo-sensing area 406 from metal layer 432. Next, the substrate is exposed to a thermal environment in a rapid thermal treatment process to form silicide 434. The temperature of the thermal environment can range from about 500 degrees Celsius to about 900 degrees Celsius. The temperature can be dependent on the composition of metal layer 432. For example, if metal layer 432 is titanium, the temperature may range from about 600 degrees Celsius to about 800 degrees Celsius in a specific embodiment. In FIG. 4H, after thermal treatment and silicide formation, any remaining residue of metal layer 432 is removed by an etching process. Silicide block 430 can also be removed.

Figure 5:
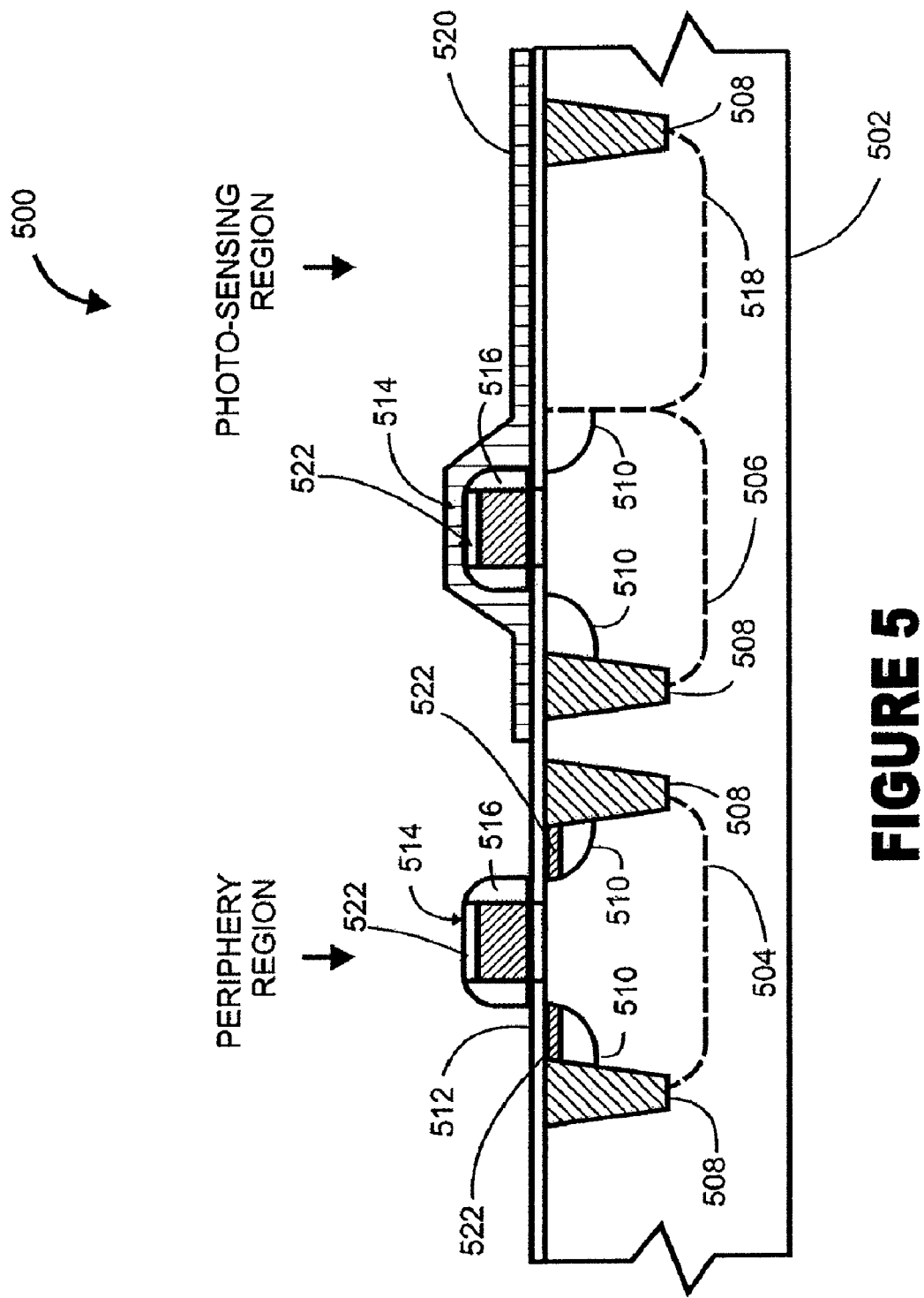
FIG. 5 illustrates a simplified CMOS imaging device according to an embodiment of the present invention.

As shown in FIG. 5, a simplified device 500 for image sensing according to an embodiment of the present invention is provided. The device 500 includes the following components:
1. Substrate 502;
2. Transistor wells 504 and 506;
3. Shallow trench isolations 508;
4. Source and drain regions 510;
5. Gate oxide layer 512;
6. Gate structures 514;
7. Spacers 516;
8. Photodiode well 518;
9. Silicide block layer 520; and
10. Silicide formation regions 522.

The above group of components provide a device according to an embodiment of the present invention. Other alternatives can also be provided where components are added, one or more components are removed, or one or more components are provided in a different arrangement without departing from the scope of the claims herein. For example, a source follower, a selecting transistor, and a bias resistor are also provided to the device 500. As another example, the device 500 is fabricated according to the method 300.

Although a number of specific embodiments are shown and described above, embodiments of the invention are not limited thereto. For example, it is understood that the doping polarities of the structures shown and described could be reversed and/or the doping concentrations of the various elements could be altered without departing from the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a CMOS image sensor, the method comprising:
   providing a semiconductor substrate;
   forming at least one isolation region between a periphery region of the substrate and a photo-sensing region of the substrate;
   forming a first well in the periphery region and a second well in the photo-sensing region of the substrate;
   forming a third well in the photo-sensing region of the substrate, the third well being associated with a photodiode;
   depositing a gate oxide layer on a surface of the substrate;
   depositing a polysilicon layer over the gate oxide layer;
   depositing a first metal layer over the polysilicon layer;
   etching the polysilicon layer and first metal layer to form an least one gate in the photo-sensing region and at least one gate in the periphery region;
   forming spacers for each of the at least one gate in the photo sensing region and the at least one gate in the periphery region;
   implanting a first plurality of ions to form at least two doped regions in the first well;
   implanting a second plurality of ions to form a doped region in the second well;
   depositing a silicide block layer over the photo-sensing region of the substrate,
   wherein the silicide block layer extends over the entire photo-sensing region of the substrate including the entire part of the at least one gate in the photo-sensing region;
   depositing a second metal layer at least over the periphery region after deposition of the silicide block layer;
   exposing the substrate to a thermal environment to simultaneously form silicide in the at least two doped regions in the first well and the at least one gate in the photo-sensing region; and
   etching after the exposing to the thermal environment to remove the second metal layer.

2. The method of claim 1 wherein the first metal layer comprises at least one of tungsten, Ti, nickel, and cobalt.

3. The method of claim 1 wherein the second metal layer comprises at least one of tungsten, Ti, nickel, and cobalt.

4. The method of claim 1 wherein the silicide block layer comprises an oxide.

5. The method of claim 1 wherein the silicide block layer comprises at least one of silicon oxide and silicon dioxide.

6. The method of claim 1 wherein the second metal layer extends over the entire silicide block layer.

7. The method of claim 1 wherein the thermal environment comprises a temperature ranging from about 500 degrees Celsius to about 900 degrees Celsius.

8. The method of claim 1 wherein the at least one isolation region comprises at least one of silicon oxide and silicon dioxide.

* * * * *